United States Patent
Wan et al.

(10) Patent No.: US 11,121,113 B2
(45) Date of Patent: Sep. 14, 2021

(54) BONDING APPARATUS INCORPORATING VARIABLE FORCE DISTRIBUTION

(71) Applicant: ASM Technology Singapore Pte Ltd, Singapore (SG)

(72) Inventors: Ming Yeung Wan, Hong Kong (HK); Wai Kin Cheung, Hong Kong (HK); Yu Fu Cheung, Hong Kong (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 64 days.

(21) Appl. No.: 16/744,280

(22) Filed: Jan. 16, 2020

(65) Prior Publication Data

US 2021/0225800 A1    Jul. 22, 2021

(51) Int. Cl.
*H01L 23/00* (2006.01)
*H01L 21/67* (2006.01)
*H01L 21/68* (2006.01)

(52) U.S. Cl.
CPC .............. *H01L 24/75* (2013.01); *H01L 24/83* (2013.01); *H01L 21/67259* (2013.01); *H01L 21/68* (2013.01); *H01L 2224/7592* (2013.01); *H01L 2224/75843* (2013.01); *H01L 2224/8085* (2013.01); *H01L 2224/8317* (2013.01); *H01L 2224/8385* (2013.01); *H01L 2224/83121* (2013.01); *H01L 2224/83169* (2013.01); *H01L 2224/83908* (2013.01); *H01L 2224/95121* (2013.01); *H01L 2224/95148* (2013.01)

(58) Field of Classification Search
CPC ......... H01L 24/75001; H01L 24/75705; H01L 24/75821; H01L 24/7592; H01L 24/75842; H01L 2224/8085; H01L 2224/83121; H01L 2224/83169; H01L 2224/8317; H01L 2224/8385; H01L 2224/83908; H01L 2224/95121; H01L 2224/95148
See application file for complete search history.

(56) References Cited

U.S. PATENT DOCUMENTS 9,243,894 B2 * 1/2016 Yamauchi .............. G01B 11/14
10,141,215 B2 * 11/2018 Wendt .................... H01L 24/83

* cited by examiner

*Primary Examiner* — David A Zarneke
(74) *Attorney, Agent, or Firm* — Ostrolenk Faber LLP

(57) ABSTRACT

A bonding apparatus includes a holding element, holding element actuators, sensors, a controller and bond force adjusting actuators. In use, the holding element holds an electrical component and is moved by the holding element actuators in one or more actuating directions to contact the electrical component with a base member. The sensors measure reaction forces exerted on the holding element in response to contact between the electrical component and the base member. The controller determines bond forces to be exerted on actuating areas of the holding element during a bonding process based on the measured reaction forces, and the bond force adjusting actuators exert these bond forces on the actuating areas of the holding element during the bonding process, so as to adjust a tilt of the electrical component relative to the base member.

19 Claims, 13 Drawing Sheets

BONDING APPARATUS INCORPORATING VARIABLE FORCE DISTRIBUTION

FIELD OF THE INVENTION

The present invention generally relates to a bonding apparatus with a mechanism for adjusting a distribution of forces or tilt of an electrical component (e.g. a die) relative to a base member (e.g. a substrate) when bonding the electrical component.

BACKGROUND OF THE INVENTION

The fabrication of a semiconductor device often involves a bonding process during which, an electrical component is attached to a base member using a bonding material. For example, the electrical component may be a die, the base member may be a substrate, and the bonding material may be an adhesive such as epoxy. A bonding process is usually performed with a bonding apparatus including a pick up tool such as a bond head. The bond head picks up an electrical component from a component holder, for example a wafer or wafer tray, and then places the electrical component into contact with a base member on which bonding material has been dispensed. Bond forces are then exerted on the electrical component to urge the electrical component against the base member to conduct bonding. The bond forces are typically exerted over a certain period of time. During this period of time, thermal treatment may be applied to the bonding material to change a state of the bonding material, so that the bonding material is capable of holding the electrical component and the base member together.

Occasionally, the bond head may be tilted when placing the electrical component into contact with the base member. This may in turn cause the electrical component to be tilted with respect to the base member during the bonding process. As a result, misalignment between the electrical component and the base member may occur and this can affect the quality of the semiconductor device eventually formed.

Conventional methods to address the above issue include detecting a tilt in the bond head, measuring the extent of this tilt and adjusting the bond head to correct the tilt. A tilt in the bond head may be detected in various ways. For example, contact sensors may be used to check if any part of the electrical component is not in proper contact with the base member. Alternatively, displacement sensors may be used to measure the displacements of various parts of the electrical component relative to the base member. Pressure detectors, such as pressure paper, may also be employed to determine a distribution of pressure exerted by the electrical component on the base member and uneven pressure distribution may be an indication that the bond head is tilted. After detecting the presence of a tilt in the bond head, a calibration tool is usually employed to measure the extent of this tilt and the bond head is adjusted accordingly based on this measurement.

Although the above-mentioned conventional methods may reduce the tilt of the electrical component relative to the base member during the bonding process, these methods are time consuming and are separately performed offline. In particular, a considerable amount of time is required to detect, measure and correct the tilt of the bond head before the bonding process is started. This affects the amount of time required to manufacture each semiconductor device, and hence, the yield is compromised. Further, the calibration tools used in the methods may not accurately measure the extent of tilt of the electrical components relative to the base members due to variations in the thicknesses of different electrical components and base members. Thus, the tilt of the bond head may often be over corrected or insufficiently corrected.

SUMMARY OF THE INVENTION

The present invention aims to provide a new and useful bonding apparatus.

In general terms, the present invention proposes a bonding apparatus with a mechanism to adjust a tilt of an electrical component relative to a base member, where the mechanism uses sensors to measure reaction forces in response to contact between the electrical component and the base member, and actuators to exert bond forces (determined based on the measured reaction forces) on the electrical component during the bonding process.

Specifically, a first aspect of the present invention is a bonding apparatus including: a holding element configured to hold an electrical component; a plurality of holding element actuators configured to move the holding element in one or more actuating directions to contact the electrical component with a base member, wherein the one or more actuating directions are arranged to be generally parallel to a central axis of the holding element extending through the electrical component and the base member; a plurality of sensors, each sensor being configured to measure a reaction force exerted on the holding element at a respective position on the holding element in response to contact between the electrical component and the base member; a controller configured, based on the reaction forces measured at the respective positions, to determine bond forces to be exerted at two or more actuating areas of the holding element during a bonding process to bond the electrical component to the base member; and a plurality of bond force adjusting actuators operative to exert the determined bond forces at the corresponding actuating areas of the holding element during the bonding process.

With the above bonding apparatus, an initial contact between the electrical component and the base member can first be achieved using the holding element actuators and a finer adjustment of the tilt of the electrical component relative to the base member may then be performed using the sensors and the bond force adjusting actuators in real time. The sensors measure reaction forces indicative of the tilt of the electrical component relative to the base member, and the bond force adjusting actuators exert bond forces (determined based on the measured reaction forces) during the bonding process, where the bond forces help to adjust the tilt of the electrical component relative to the base member. Accordingly, unlike in the prior art, the tilt adjustment of the electrical component by the above bonding apparatus is performed in real time during the bonding process. Further, different electrical components and base members may have different characteristics e.g. different thickness. Since in the above bonding apparatus, the tilt adjustment of each electrical component is based on the output from the sensors obtained in response to contact between this particular electrical component and the particular base member it is to be bonded to, the tilt adjustment better matches the electrical component and the base member. Hence, the quality of the joint between each electrical component and the respective base member can be improved.

The holding element and the plurality of bond force adjusting actuators may be operatively connected to be movable together in the one or more actuating directions. The relative positions of the bond force adjusting actuators and the holding element can thus remain relatively consistent and sufficiently near, so that the tilt adjustment of the electrical component by the bond force adjusting actuators can be more accurate.

An actuating member may be connected between the plurality of bond force adjusting actuators and the holding element. The bond force adjusting actuators can exert bond forces on the holding element via the actuating member. Further actuators may be connected to the actuating member to move the holding element, and hence, using the actuating member may allow a greater degree of freedom in the movement of the holding element.

The actuating member may include a first and a second actuating member portion respectively having a first and a second elongate aperture oriented parallel to the central axis. The first actuating member portion may be nearer to the holding element than the second actuating member portion and the first elongate aperture may have a diameter smaller than a diameter of the second elongate aperture. Using a hollow actuating member can help reduce the weight of the bonding apparatus and reduce the amount of force required to move the actuating member. The difference in diameters of the first and second elongate apertures can increase the weight of the actuating member nearer the holding element, and allow the actuating member to move the holding element with less force and with greater stability.

The bonding apparatus may further include a compliant element coupled to the actuating member. The compliant element may be compressible by rotation of the actuating member about one or more axes perpendicular to the central axis. This helps to reduce the friction exerted against movement of the actuating member along the central axis and also allows rotation of the actuating member.

The bond force adjusting actuators may be arranged equidistant around the central axis. This helps to achieve a more balanced distribution of the bond forces exerted on the holding element.

For example, the plurality of bond force adjusting actuators may include first, second, third and fourth bond force adjusting actuators. The first bond force adjusting actuator may be arranged diametrically opposite to the third bond force adjusting actuator with respect to the central axis, and the second bond force adjusting actuator may be arranged diametrically opposite to the fourth bond force adjusting actuator with respect to the central axis. This can help achieve a two-dimensional exertion of the bond forces to better adjust the tilt of the electrical component relative to the base member.

At least one of the plurality of bond force adjusting actuators may be aligned on an axis that is the same as or parallel to an axis of at least one of the plurality of sensors. This can facilitate the determination of the bond forces to be exerted by the bond force adjusting actuators based on the reaction forces measured by the sensors.

The plurality of bond force adjusting actuators may be operative to exert different bond forces at different corresponding actuating areas of the holding element during the bonding process. This can help adjust the tilt of the electrical component relative to the base member.

The plurality of holding element actuators may be operative to tilt the holding element about one or more axes perpendicular to the central axis. This can allow the electrical component to contact the base member at an angle, so that voids between the electrical component and the base member can be removed by subsequent controlled movement of the holding element.

The bonding apparatus may further include a plurality of connectors, and each of the plurality of holding element actuators may be configured to urge a respective one of the plurality of connectors in one or more directions parallel to the central axis, to move the holding element in the one or more actuating directions. This can allow the holding element actuators to move the holding element together with the bond force adjusting actuators in the one or more actuating directions, and also to tilt the holding element.

The bonding apparatus may further include a rotational actuator configured to rotate the holding element about the central axis. This allows a greater degree of freedom in the movement of the holding element.

The controller may be configured to determine the bond force to be exerted by each of the plurality of bond force adjusting actuators based on a reaction force measured by one of the plurality of sensors nearest to the bond force adjusting actuator. This helps to simplify the determination of the bond forces based on the measured reaction forces.

A number of bond force adjusting actuators may be equal to a number of sensors. This helps to simplify the determination of the bond forces based on the measured reaction forces. Alternatively, a number of sensors may be more than a number of bond force adjusting actuators. This helps to reduce the number of components in the bonding apparatus and in turn, helps to reduce the costs of manufacturing the bonding apparatus.

A second aspect of the present invention is a method for bonding an electrical component to a base member, the method including: moving a holding element holding the electrical component in one or more actuating directions to contact the electrical component with the base member, wherein the one or more actuating directions are generally parallel to a central axis of the holding element extending through the electrical component and the base member; measuring reaction forces exerted on the holding element with sensors at respective positions on the holding element in response to contact between the electrical component and the base member; determining bond forces to be exerted on two or more actuating areas of the holding element during a bonding process to bond the electrical component to the base member, where the bond forces are determined based on the measured reaction forces; and exerting the determined bond forces at the actuating areas of the holding element during the bonding process.

Moving the holding element may further include: tilting the holding element about an axis perpendicular to the central axis; contacting the electrical component with the base member while the holding element remains tilted; and rotating the holding element about the axis perpendicular to the central axis to further contact the electrical component with the base member until the electrical component becomes substantially parallel to the base member. This helps to remove any voids (such as air bubbles) between the electrical component and the base member. In turn, the quality of the joint between the electrical component and the base member can be improved and the yield of the device manufacturing process can be increased.

Rotating the holding element about the axis perpendicular to the central axis may further include: exerting a first force in a direction away from the base member on a first side of the holding element; and exerting a second force in a direction towards the base member on a second side of the holding element, wherein the second force is larger than the first force. Such force control can help to balance the bond load and also helps to more gradually remove the voids between the electrical component and the base member, so that any voids can be more thoroughly removed.

The reaction forces may include a first reaction force exerted on a first position of the holding element and a second reaction force exerted on a second position of the holding element, and the method may further include repeatedly measuring the reaction forces, determining the bond forces based on the measured reaction forces and exerting the determined bond forces on the actuating areas of the holding element until a difference between the first and second reaction forces is below a predetermined threshold. In this manner, the tilt of the electrical component relative to the base member can be repeatedly adjusted and fine-tuned, until the electrical component is sufficiently parallel to the base member for a particular bonding process.

BRIEF DESCRIPTION OF THE FIGURES

Embodiments of the invention will now be illustrated for the sake of example only with reference to the following drawings, in which:

FIGS. 1A, 1B and 1C respectively show a perspective view, a top view and a partial cutaway front view of a bonding apparatus according to an embodiment of the present invention, while

DETAILED DESCRIPTION OF THE EMBODIMENTS

Figure 1A:
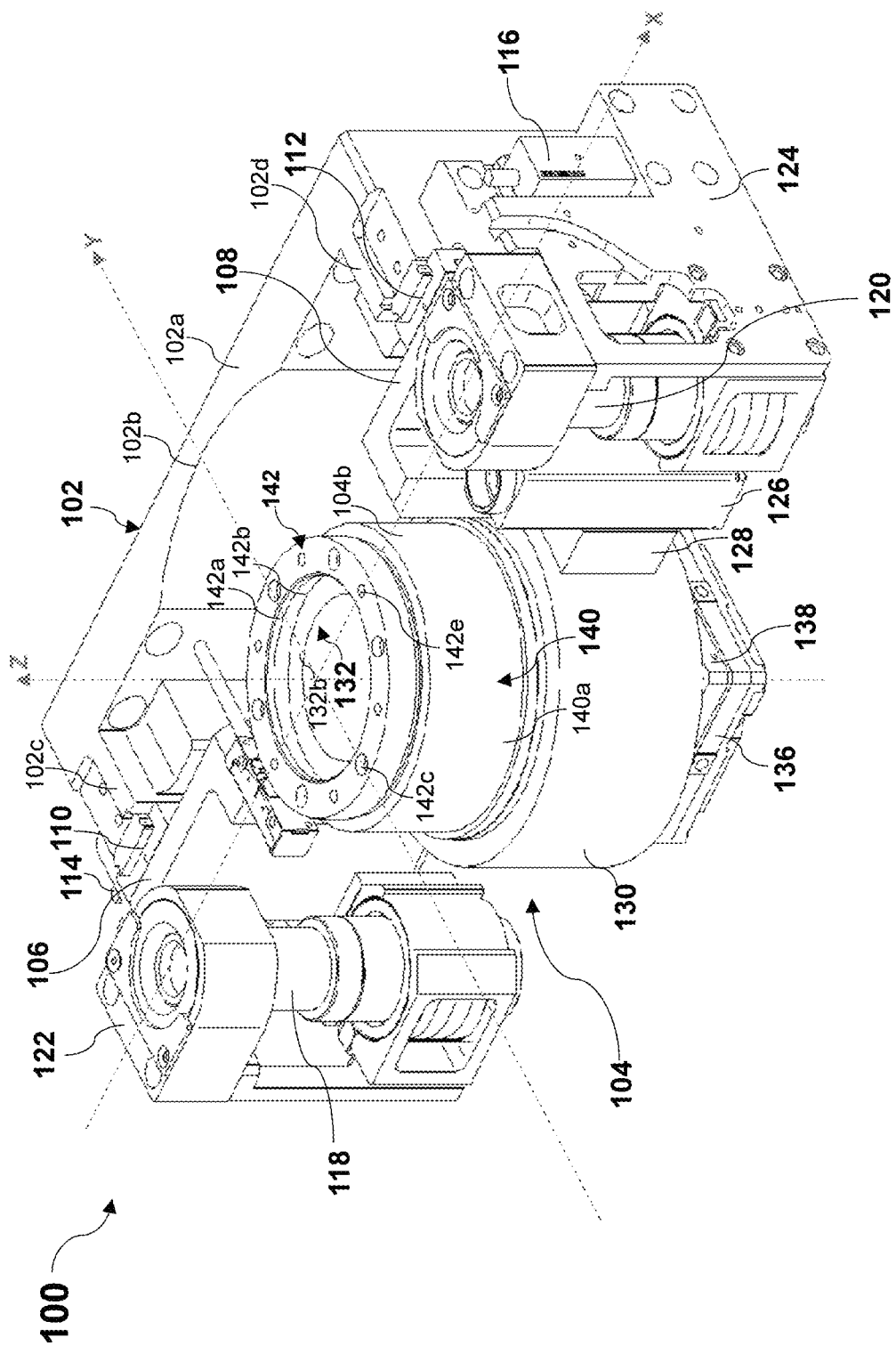
Figure 1B:
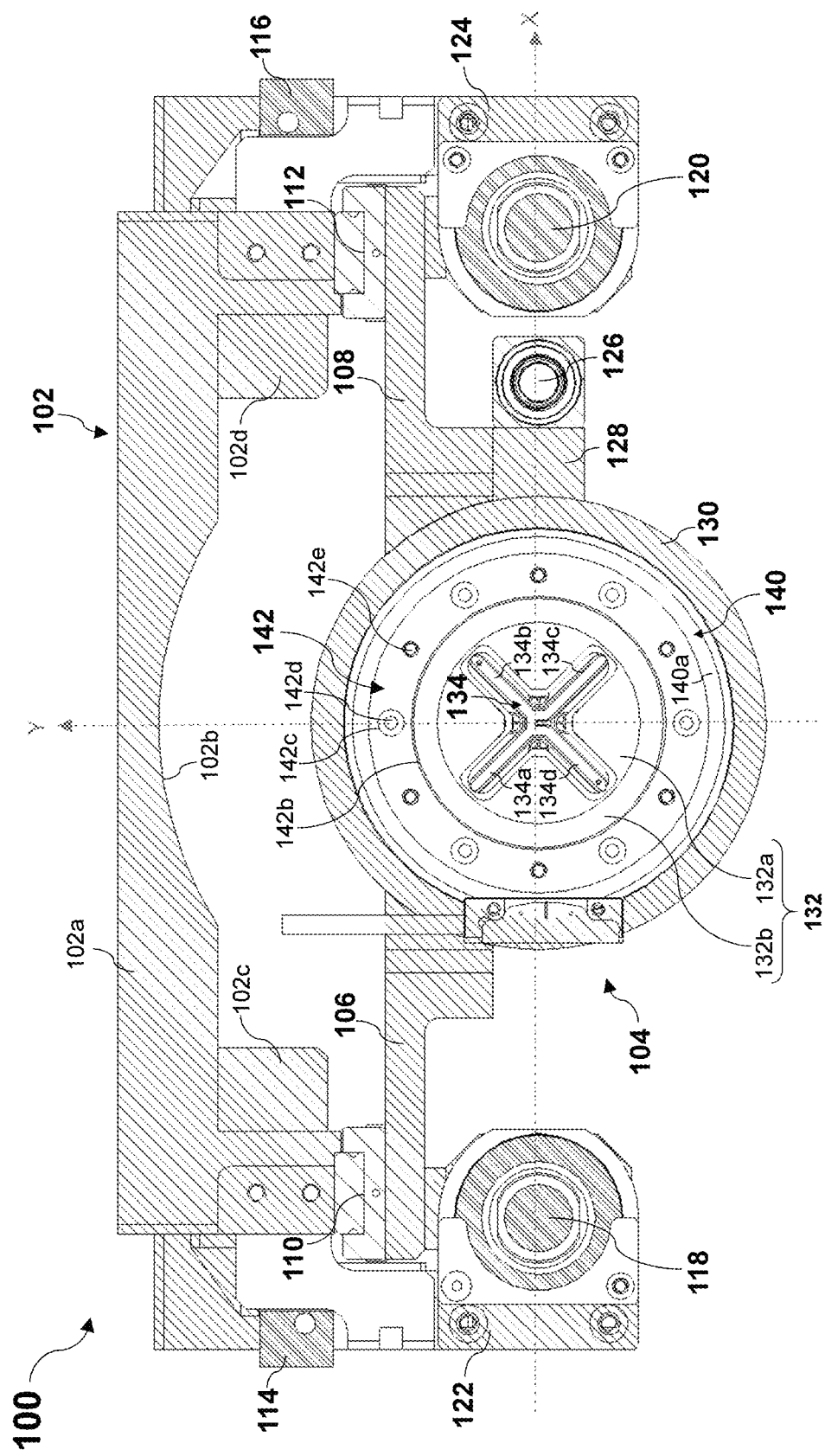
Figure 1C:
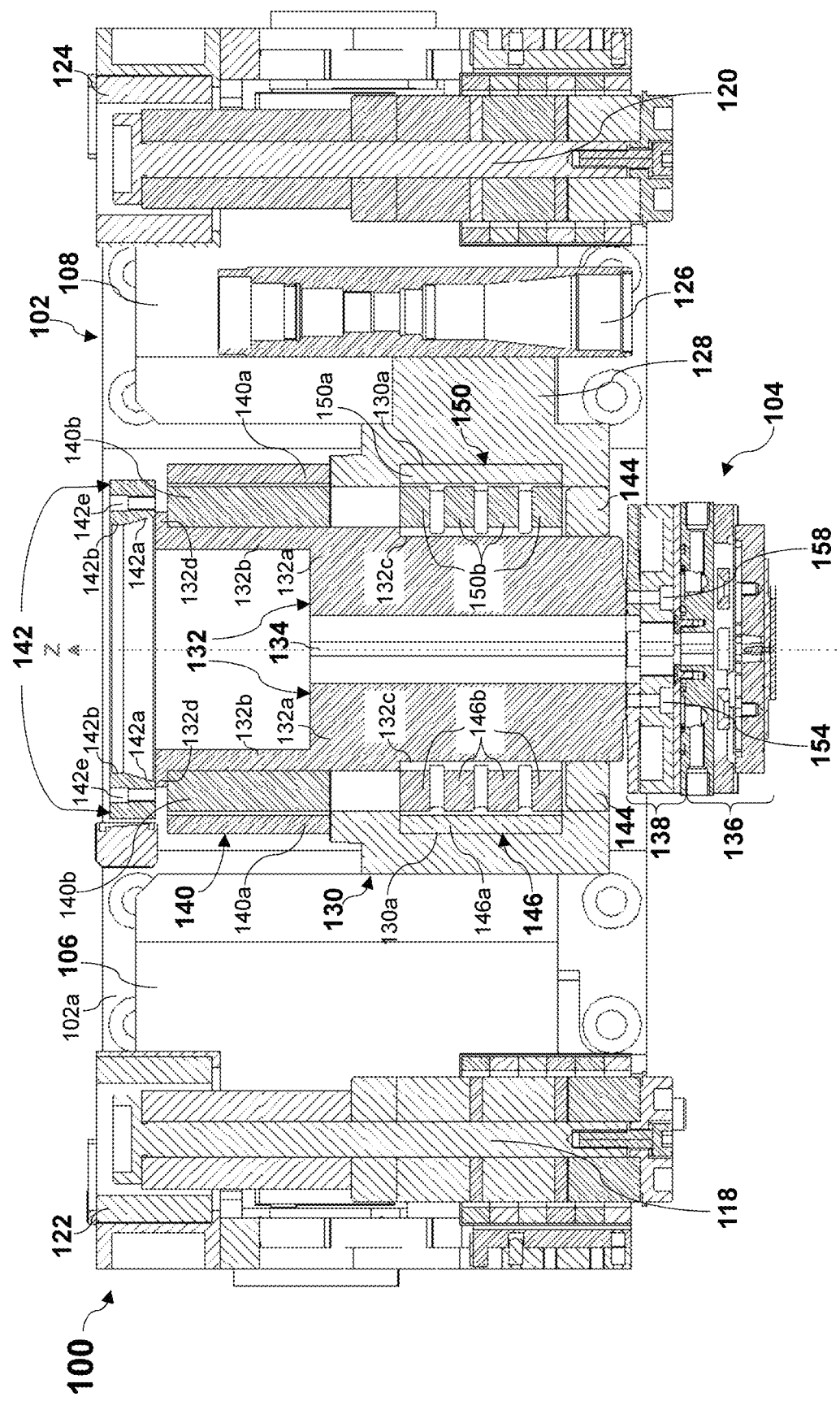

FIGS. 1A and 1B respectively show a perspective view and a top view of a bonding apparatus 100 according to an embodiment of the present invention. FIG. 1C shows a partial cutaway front view (along the XZ plane) of the bonding apparatus 100.

The bonding apparatus 100 includes a frame 102. The frame 102 has a substantially rectangular base member 102a residing in a plane parallel to the XZ plane. A curved indentation 102b extends parallel to a central axis (Z axis) along a middle portion of an inner surface of the base member 102a. The frame 102 also includes first and second elongate frame extensions 102c, 102d protruding from the inner surface of the base member 102a. The frame extensions 102c, 102d extend generally parallel to the curved indentation 102b and parallel to each other along opposite widths of the base member 102a.

The bonding apparatus 100 further includes a bond head structure 104 configured to hold an electrical component, such as but not limited to, a die. The bond head structure 104 is movably connected to the frame 102. As shown in FIGS. 1A to 1C, the bonding apparatus 100 has a plurality of connectors including first and second bond head connectors 106, 108 connected to opposite first and second sides of the bond head structure 104. The first bond head connector 106 is connected to a first guide element 110 and the second bond head connector 108 is connected to a second guide element 112. The first and second guide elements 110, 112 are respectively connected to the first and second frame extensions 102c, 102d of the frame 102.

The bonding apparatus 100 further includes first and second encoder elements 114, 116. The guide elements 110, 112 are in the form of Z linear guides and the encoder elements 114, 116 are in the form of Z linear encoders. The first encoder element 114 is configured to cooperate with the first guide element 110 to determine a displacement parallel to the Z axis of the first bond head connector 106 relative to the frame 102 (in particular, the first frame extension 102c). The second encoder element 116 is configured to cooperate with the second guide element 112 to determine a displacement parallel to the Z axis of the second bond head connector 108 relative to the frame 102 (in particular, the second frame extension 102d).

The bonding apparatus 100 further includes a plurality of holding element actuators including a first holding element actuator 118 and a second holding element actuator 120. The holding element actuators 118, 120 are in the form of motors. Each holding element actuator 118, 120 is held within a respective actuator holder 122, 124 which is in turn connected to a respective frame extension 102c, 102d of the frame 102. The holding element actuators 118, 120 are configured to move the bond head structure 104 in one or more actuating directions parallel to the Z axis to contact an electrical component held by the bond head structure 104 with a base member. More specifically, the first and second holding element actuators 118, 120 are respectively connected to the first and second bond head connectors 106, 108. Each holding element actuator 118, 120 is configured to urge the respective bond head connector 106, 108 relative to the frame 102 in one or more directions parallel to the Z axis, to move the bond head structure 104 in the actuating direction(s). Further, the holding element actuators 118, 120 are also operative to tilt the bond head structure 104 about the X and Y axes perpendicular to the Z axis.

As shown in FIGS. 1A to 1C, the bonding apparatus 100 further includes an imaging unit 126 connected to the bond head structure 104 via a connecting element 128. The imaging unit 126 is configured to capture images of electrical components held by the bond head structure 104.

The bond head structure 104 will now be described in greater detail.

Referring to FIGS. 1A to 1C, the bond head structure 104 includes an actuator casing 130 in the form of a stationary bracket. The actuator casing 130 has a cylindrical structure with a central aperture and as shown in FIG. 1C, a recess 130a is provided around an inner surface of the actuator casing 130.

As shown in FIG. 1C, an actuating member 132 in the form of a shaft is arranged through the central aperture of the actuator casing 130. In particular, the actuating member 132 includes a first actuating member portion 132a and a second actuating member portion 132b arranged over the first actuating member portion 132a. Referring to FIGS. 1B and 1C, each of the first and second actuating member portions 132a, 132b has a hollow cylindrical structure. In particular, the first actuating member portion 132a has a first elongate aperture and the second actuating member portion 132b has a second elongate aperture. Each elongate aperture extends approximately through a middle of the respective cylindrical structure, and is oriented parallel to the Z axis. The first elongate aperture of the first actuating member portion 132a has an X-shaped cross-sectional surface, whereas the second elongate aperture of the second actuating member 132b has a circular cross-sectional surface. The centres of the first and second elongate apertures are approximately aligned, with the X-shaped cross-sectional surface of the first elongate aperture having a smaller diameter (or in other words, a smaller dimension between two furthest ends of the cross-sectional surface) than the circular cross-sectional surface of the second elongate aperture. The actuating member 132 further includes a recess 132c around an outer surface of the first actuating member portion 132a. As shown in FIG. 1C, the recess 132c of the actuating member 132 is arranged to face the recess 130a of the actuator casing 130, with the tops of these recesses 130a, 132c aligned. In addition, the actuating member 132 also includes an extension 132d protruding from an outer surface of the second actuating member portion 132b around a top of this portion 132b.

As shown in FIGS. 1B and 1C, the bonding apparatus 100 further includes a support element 134 having an X-shaped cross-sectional surface extending through the first elongate aperture of the first actuating member portion 132a. In particular, the support element 134 includes four arms 134a-134d, where each pair of adjacent arms 134a-134d defines a tapered elongate recess.

The bond head structure 104 further includes a holding element 136 in the form of a pick-up tool/bond head configured to hold an electrical component, such as a die. The holding element 136 is coupled to the actuating member 132, with a sensor unit 138 provided between the holding element 136 and the actuating member 132. In particular, the actuating member 132 is arranged with respect to the holding element 136, such that the first actuating member portion 132a is nearer to the holding element 136 than the second actuating member portion 132b.

The bond head structure 104 further includes a rotational actuator 140 having a stationary element 140a in the form of a stationary theta magnet and a movable element 140b in the form of a movable theta coil. The stationary and movable elements 140a, 140b of the rotational actuator 140 have hollow cylindrical structures with central apertures. The movable element 140b is arranged within the central aperture of the stationary element 140a which is in turn arranged on the actuator casing 130. As shown in FIG. 1C, the actuating member 132 extends beyond the central aperture of the actuator casing 130 into the central aperture of the movable element 140a of the rotational actuator 140. The rotational actuator 140 is configured to rotate the actuating member 132 (and hence, the holding element 136) about the central axis (Z axis). In particular, the movable element 140b of the rotational actuator 140 is connected to the actuating member 132, more specifically, the second actuating member portion 132b and the extension 132d. The rotational actuator 140 can be actuated to rotate the movable element 140b (together with the actuating member 132 connected to it) about the Z-axis relative to the stationary element 140a.

As shown in FIGS. 1A to 1C, a cover 142 is provided over the actuating member 132. Referring to FIG. 1C, the cover 142 is arranged to sit on the extension 132d of the actuating member 132. The cover 142 includes lower and upper inner surfaces 142a, 142b. The upper inner surface 142b defines a cylindrical aperture, whereas the lower inner surface 142a tapers towards the upper inner surface 142b and defines a frusto-conical aperture. A top of this frusto-conical aperture is aligned with the cylindrical aperture defined by the upper inner surface 142b. As shown in FIGS. 1A and 1B, the cover 142 includes a plurality of circular recesses 142c, together with respective first engaging elements 142d provided therein. A plurality of second engaging elements 142e extends through the cover 142 as shown in FIG. 1C. The circular recesses 142c and the second engaging elements 142e are arranged in an alternating manner around a top surface of the cover 142.

Figure 1D:
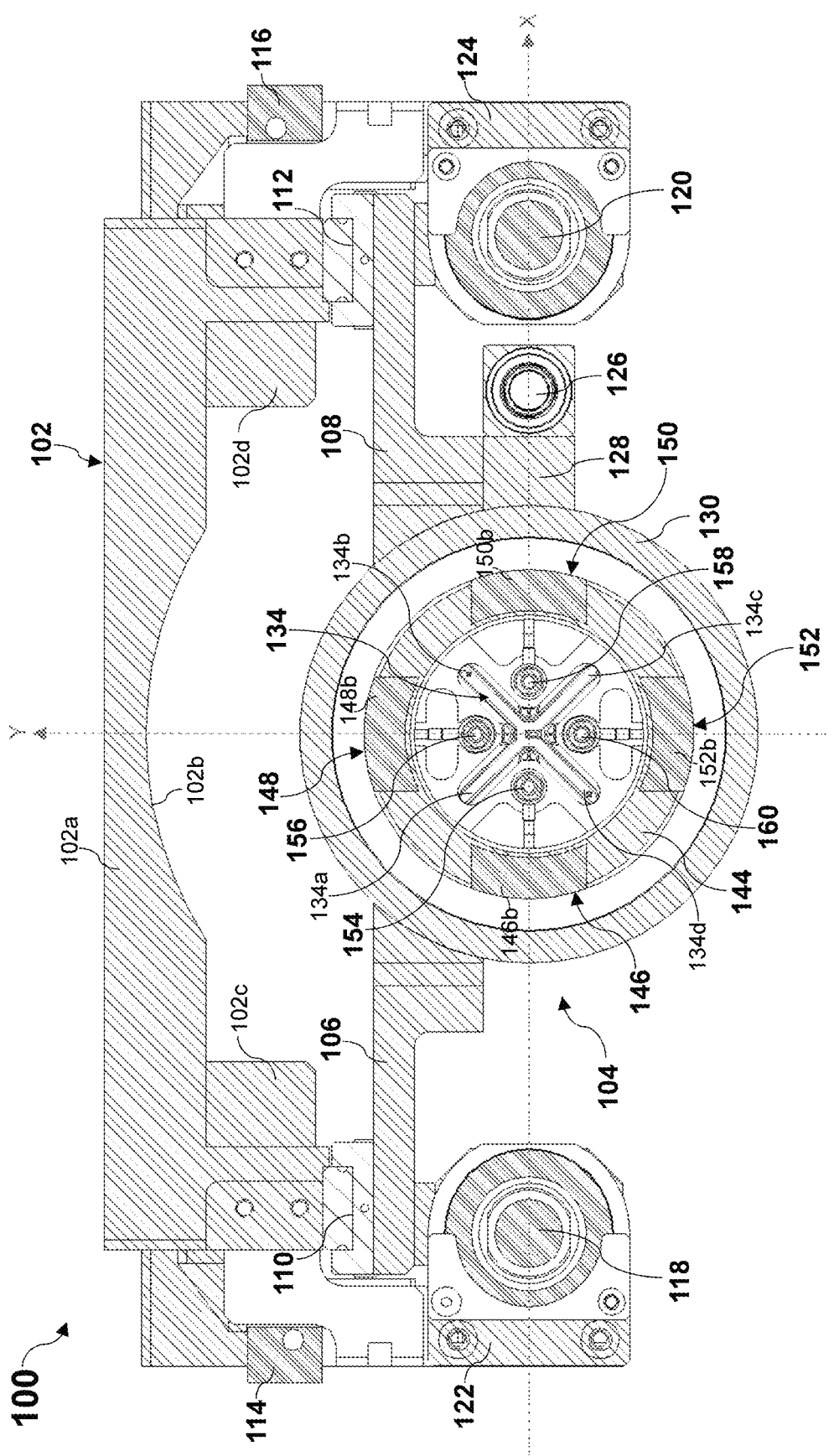
FIG. 1D shows a top view of the bonding apparatus of FIGS. 1A to 1C with some parts of the bonding apparatus removed.

FIG. 1D shows a top view of a part of the bonding apparatus 100, in particular, with the actuating member 132, the rotational actuator 140 and the cover 142 removed.

Figure 1E:
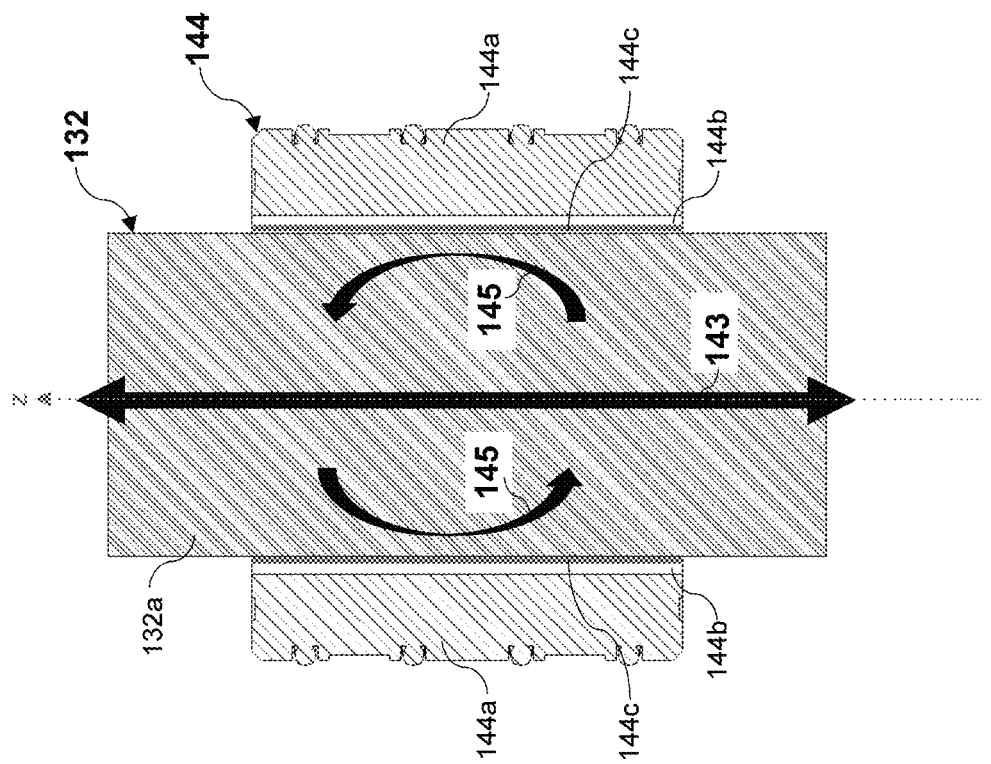
FIG. 1E shows a compliant element of the bonding apparatus of FIGS. 1A to 1C.

Referring to FIGS. 1C and 1D, the bonding apparatus 100 includes a compliant element 144 having a ring structure arranged around the actuating member 132. FIG. 1E shows a magnified front view of the compliant element 144 and a part of the actuating member 132. As shown in FIG. 1E, the compliant element 144 is in the form of a compliant air bearing having a housing 144a, a compliant compartment 144b and a thin film of air 144c within the compliant compartment 144b. A thin film of air 144c includes compressed air and serves as a compliant layer. As shown in FIG. 1C, the compliant element 144 is arranged between the actuator casing 130 and the actuating member 132. In particular, the compliant element 144 is arranged between the recess 132c of the actuating member 132 and a portion of the actuator casing 130 below the recess 130a of this casing 130. The actuating member 132 is movable along the Z axis relative to the compliant element 144 (as indicated by the arrow 143 in FIG. 1E) and the compliant element 144 serves to reduce the frictional force against this movement. Further, the compliant element 144 is compressible by rotation of the actuating member 132 about one or more axes perpendicular to the Z axis. For example, when a moment force is exerted on the actuating member 132, the actuating member 132 can rotate about the Y axis (as indicated by the arrows 145) by compressing the compliant element 144. However, the compliant compartment 144a also has a degree of stiffness such that only a limited portion of it is compressible. Accordingly, the degree of rotation of the actuating member 132 about axes perpendicular to the Z axis is limited.

Referring to FIGS. 1C and 1D, the bond head structure 104 further includes a plurality of bond force adjusting actuators including a first bond force adjusting actuator 146, a second bond force adjusting actuator 148, a third bond force adjusting actuator 150 and a fourth bond force adjusting actuator 152 in the form of motors. The actuating member 132 is connected between the plurality of bond force adjusting actuators 146-152 and the holding element 136. In particular, each bond force adjusting actuator 146-152 is connected to a respective side of the actuating member 132, and the actuating member 132 is in turn connected to the holding element 136 via the sensor unit 138. The holding element 136 and the plurality of bond force adjusting actuators 146-152 are thus operatively connected to be movable together in one or more actuating directions by the holding element actuators 118, 120.

As shown in FIG. 1D, the bond force adjusting actuators 146-152 are arranged equidistant around the Z axis, or more specifically, around the actuating member 132. The bond force adjusting actuators 146-152 are symmetrically arranged about the X and Y axes with the first and third bond force adjusting actuators 146, 150 aligned on the X axis, and the second and fourth bond force adjusting actuators 148, 152 aligned on the Y axis. The first bond force adjusting actuator 146 is arranged diametrically opposed to the third bond force adjusting actuator 150 with respect to the Z axis, and the second bond force adjusting actuator 148 is arranged diametrically opposed to the fourth bond force adjusting actuator 152 with respect to the Z axis.

Each bond force adjusting actuator 146-152 includes a stationary element 146a, 148a, 150a, 152a in the form of a magnet and a movable element 146b, 148b, 150b, 152b in the form of a coil unit having a plurality of spaced apart coil segments. As shown in FIG. 1C, the stationary element 146a-152a of each bond force adjusting actuator 146-152 is arranged within the recess 130c of the actuator casing 130, whereas each movable element 146b-152b is arranged over the compliant element 144, with a gap provided therebetween. In addition, the movable element 140b of the rotational actuator 140 is arranged over the movable elements 146b-152b of the bond force adjusting actuators 146-152, with another gap provided therebetween.

The bond force adjusting actuators 146-152 are associated with two or more actuating areas of the holding element 136 and are configured to exert bond forces on these associated actuating areas of the holding element 136 during a bonding process. In particular, actuation of each bond force adjusting actuator 146-152 urges the movable element 146b-152b of the actuator 146-152 relative to the stationary element 146a-152a. The movable element 146b-152b of each bond force adjusting actuator 146-152 is connected to a respective side of the actuating member 132 and is configured to move with this side of the actuating member 132 parallel to the Z axis. Accordingly, actuation of a bond force adjusting actuator 146-152 causes the respective side of the actuating member 132 to move and in turn, urge the holding element 136 at an associated actuating area of the holding element 136. The bond force adjusting actuators 146-152 are independently controllable and hence, are operative to exert different bond forces at different associated actuating areas of the holding element 136 during a bonding process.

The bonding apparatus 100 further includes a sensor array having a plurality of sensors with first, second, third and fourth sensors 154, 156, 158, 160 in the form of force sensors configured to measure reaction forces exerted on the holding element 136 in response to a contact between an electrical component held by the holding element 136 and a base member. The sensors 154-160 are arranged within the sensor unit 138 between the holding element 136 and the actuating member 132. The sensors 154-160 are arranged to detect reaction forces and moments in different directions in response to the contact between the electrical component and the base member. Each sensor 154-160 is associated with a respective position on the holding element 136. As more clearly shown in FIG. 1D, the sensors 154-160 are arranged equidistant around the Z axis. In particular, the sensors 154-160 are symmetrically arranged around the Z axis with the first and third sensors 154, 158 aligned on a same axis (X axis) as the first and third bond force adjusting actuators 146, 150, and with the second and fourth sensors 156, 160 aligned on a same axis (Y axis) as the second and fourth bond force adjusting actuators 148, 152. As shown in FIGS. 1C and 1D, each sensor 154-160 is arranged to lie below a respective tapered elongate recess defined by adjacent arms 134a-134d of the support element 134.

Although not shown in the figures, the bonding apparatus 100 further includes a controller configured to determine bond forces to be exerted on two or more actuating areas of the holding element 136 during a bonding process to bond an electrical component held by the holding element 136 with a base member. The controller is operative to determine the bond forces based on the reaction forces measured by the sensors 154-160.

Figure 2A:
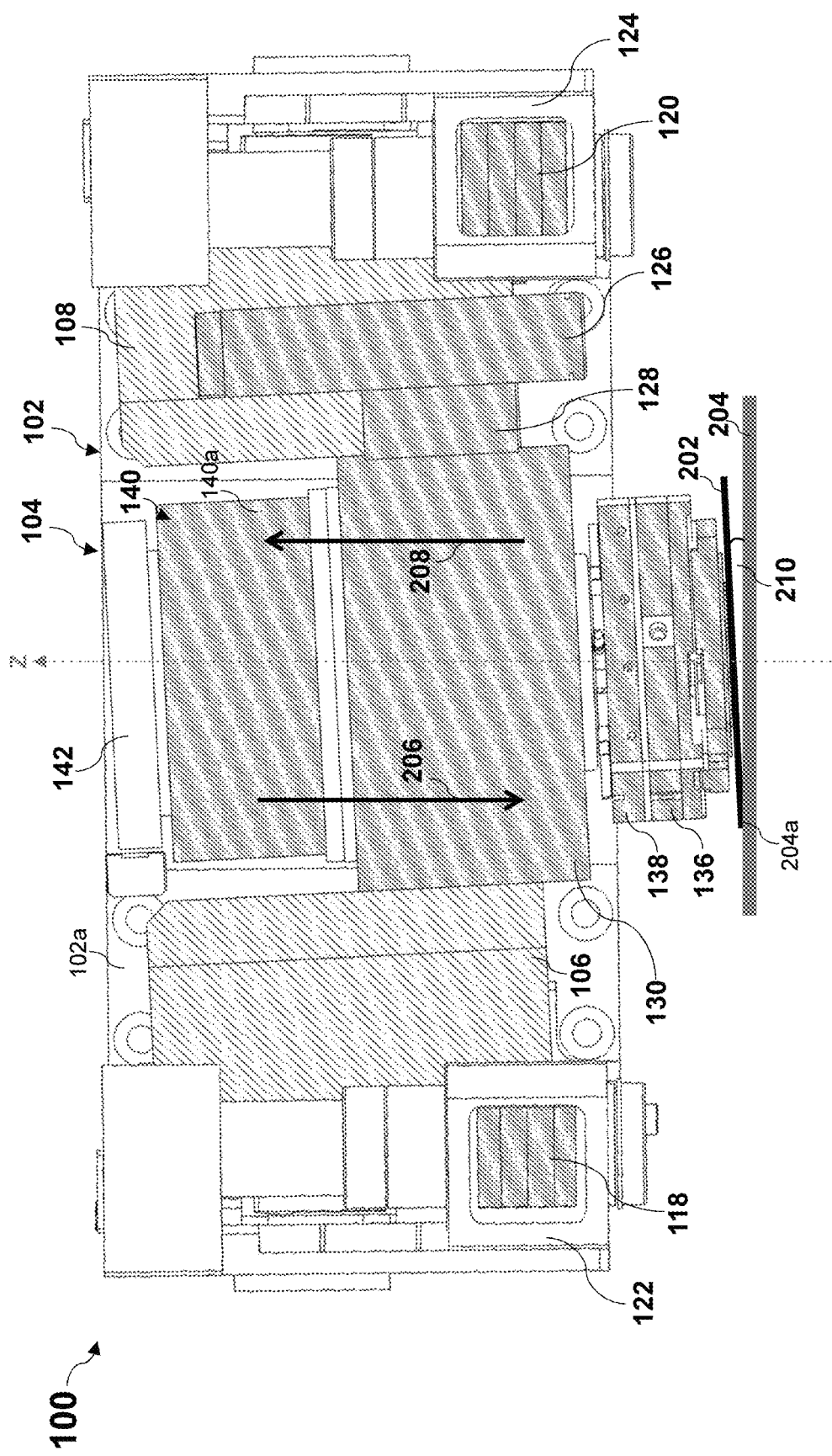
FIGS. 2A to 2C show the bonding apparatus of FIGS. 1A to 1C in use.
Figure 2C:
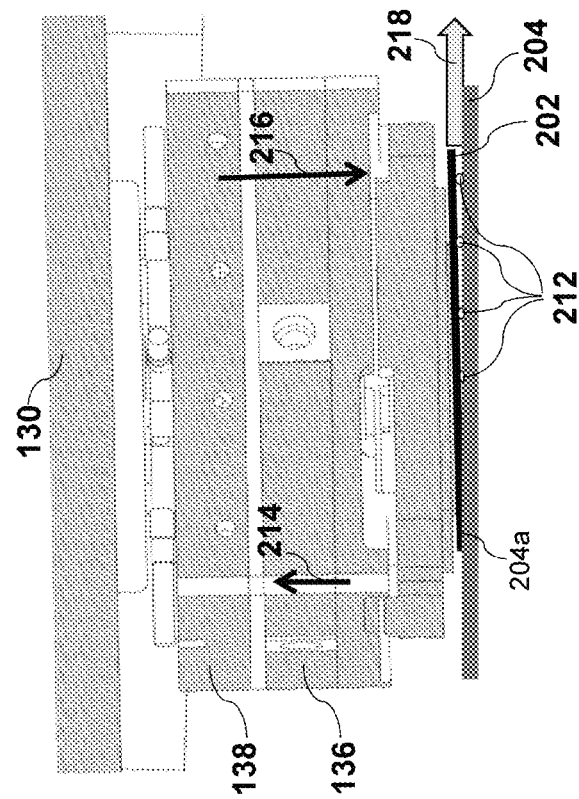
Figure 2B:
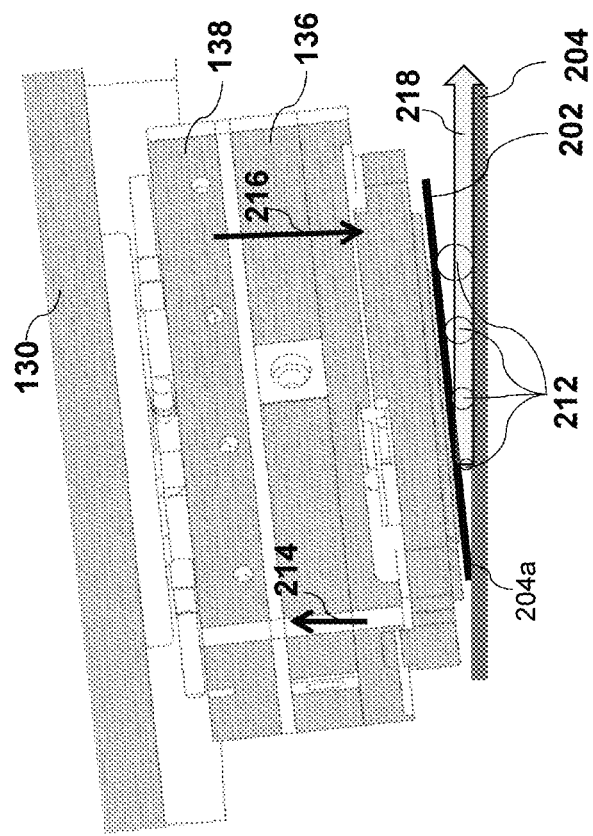
Figure 3:
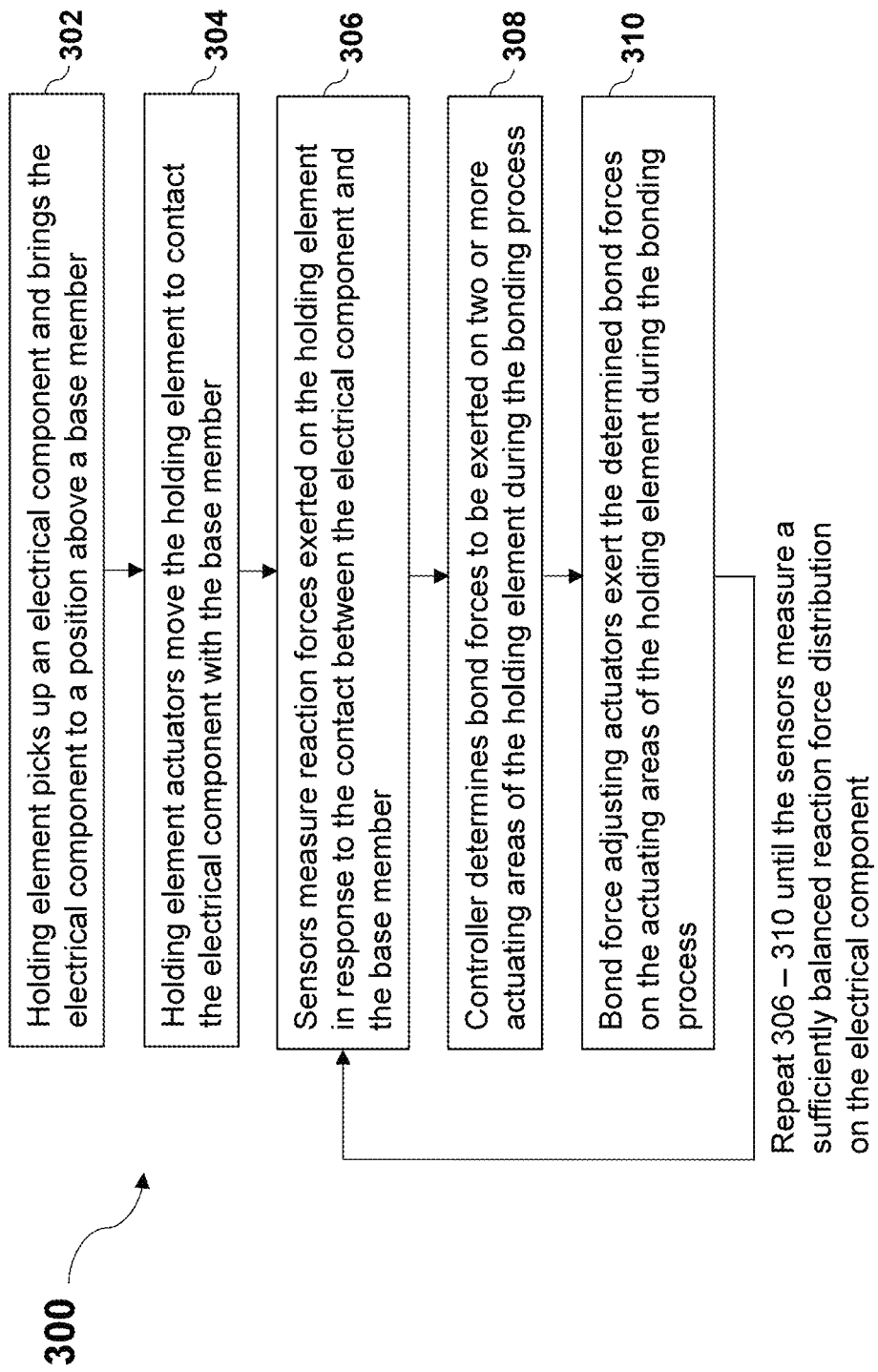
FIG. 3 shows a flow diagram of a method for bonding an electrical component to a base member using the bonding apparatus of FIGS. 1A to 1C according to an embodiment of the present invention.

FIGS. 2A to 2C show the bonding apparatus 100 in use. FIG. 3 shows a flow diagram of a method 300 for bonding an electrical component to a base member using the bonding apparatus 100. The method 300 will now be described in greater detail with reference to FIGS. 2A to 2C.

At 302, the holding element 136 of the bonding apparatus 100 picks up an electrical component 202, and brings the electrical component 202 to a position above a base member 204. At this position, the Z axis extends through the electrical component 202 and the base member 204, such as a substrate on which the electrical component 202 is to be bonded.

At 304, the holding element actuators 118, 120 move the holding element 136 (holding the electrical component 202) to contact the electrical component 202 with the base member 204.

As shown in FIG. 2A, the bonding apparatus 100 tilts the bond head structure 104 (and hence, the holding element 136) about the Y axis to contact the electrical component 202 with the base member 204. In particular, the first holding element actuator 118 is actuated to apply a downward force (in other words, a force towards the base member 204) on the first bond head connector 106 connected to the first side of the bond head structure 104, and the second holding element actuator 120 is actuated to apply an upward force (in other words, a force away from the base member 204) on the second bond head connector 108 connected to the second side of the bond head structure 104. Accordingly, the first bond head connector 106 (together with the first side of the bond head structure 104) moves in a first actuating direction 206; whereas, the second bond head connector 108 (together with the second side of the bond head structure 104) moves in a second actuating direction 208. The actuating directions 206, 208 are generally parallel to the Z axis, and are opposite to each other. Hence, this tilts the holding element 136 about the Y axis. As shown in FIG. 2A, the electrical component 202 contacts the base member 204 while the holding element 136 remains tilted. This initial contact of the electrical component 202 with the base member 204 is at a contact area 204a.

The tilt of the bond head structure 104 about the Y axis is controlled by a feedback loop. In particular, as the first and second sides of the bond head structure 104 move in the first and second actuating directions 206, 208 respectively, the displacements of the first and second bond head connectors 106, 108 relative to the frame 102 are determined by the guide elements 110, 112 and the encoder elements 114, 116, and are fed back to a controller. The controller determines the amount of further displacements to be made to the first and second bond head connectors 106, 108 to achieve the desired tilt of the bond head structure 104. The holding element actuators 118, 120 are then actuated to achieve these further displacements.

FIGS. 2B and 2C show magnified views of the holding element 136 of FIG. 2A when the electrical component 202 initially contacts the base member 204 at the contact area 204a. As shown in FIGS. 2B and 2C, a plurality of voids 212 (for example, air bubbles) may be present between the electrical component 202 and the base member 204 when the electrical component 202 initially contacts the base member 204. After this initial contact, the holding element 136 is rotated about the Y axis to further contact the electrical component 202 with the base member 204, until the electrical component 202 becomes substantially parallel to the base member 204. In particular, the first holding element actuator 118 is actuated to exert a first force in a direction away from the base member 204 (upward force) on a first side of the holding element 136 by moving the first bond head connector 106, and the second holding element actuator 120 is actuated to exert a second force in a direction towards the base member 204 (downward force) on a second side of the holding element 136 by moving the second bond head connector 108. The downward force on the holding element 136 is larger than the upward force on the holding element 136. Accordingly, the first side of the holding element 136 is lifted upwards (as indicated by the arrows 214) while the second side of the holding element 136 is pushed downwards (towards the base member 204 as indicated by the arrows 216). This gradually squeezes the voids 212 between the electrical component 202 and the base member 204, and pushes the air out of the gap in the direction away from the contact area 204a (as indicated by the arrows 218).

At 306, the sensors 154-160 measure reaction forces exerted on the electrical component 202 (and hence, on the holding element 136) in response to the contact between the electrical component 302 and the base member 204 at 304. These reaction forces are measured at respective positions of the holding element 136 associated with respective sensors 154-160. The reaction forces or in other words, the force distribution on the electrical component 202 by the base member 204, are indicative of a tilt of the holding element 136 about one or more axes perpendicular to the Z axis. For example, a greater reaction force detected by the first sensor 154 as compared to that detected by the third sensor 156 may be indicative of a tilt of the holding element 136 about the Y axis with the holding element 136 being nearer to the base member 304 along an axis on which the first sensor 154 is located than along an axis on which the third sensor 156 is located.

At 308, the controller of the bonding apparatus 100 determines bond forces to be exerted on two or more actuating areas of the holding element 136 during the bonding process to bond the electrical component 202 with the base member 204. The bond forces are determined based on the reaction forces measured by the sensors 154-160. In particular, the bond forces are determined such that exerting the bond forces on the holding element 136 rotates the holding element 136 about one or more axes perpendicular to the Z axis to cause the holding element 136 to be generally parallel with each of these axes. Further or alternatively, the controller is configured to determine that larger bond forces are to be exerted on the holding element 136 at actuating areas associated with smaller reaction forces.

At 310, the bonding process is carried out and the plurality of bond force adjusting actuators 146-152 exert the required bond forces on the associated actuating areas of the holding element 136 during the bonding process. In particular, the controller sends control signals to the bond force adjusting actuators 146-152 to exert these bond forces.

The method 300 includes repeatedly measuring the reaction forces, determining the bond forces based on the measured reaction forces and exerting the determined bond forces on the associated actuating areas of the holding element 136 at 306-310 until a sufficiently balanced reaction force distribution on the electrical component 304 is measured by the sensors 146-152. In particular, after exerting the bond forces on the holding element 136 at 310, reaction forces on the holding element 136 are again detected at 306 by the sensors 154-160 and at 308, the controller determines revised bond forces to be exerted on the holding element 136 based on the most recently detected reaction forces. At 310, the updated bond forces are exerted on the holding element 136 and 306-310 are again repeated. This continues until the reactions forces detected by the sensors 154-160 at 306 are approximately the same, or more specifically, until a difference between a first reaction force exerted on a first position of the holding element 136 and a second reaction force exerted on a second position of the holding element 136 is below a predetermined threshold.

Accordingly, a more balanced force distribution exerted on the electrical component 202 during the bonding process can be achieved with the bonding apparatus 100. More specifically, the controller, together with the sensors 154-160 and the bond force adjusting actuators 146-152, forms a closed loop servo control system capable of achieving a balanced force distribution on the electrical component 202 during the bonding process.

Various modifications may be made to the above-described embodiment.

For example, a different number of bond force adjusting actuators and/or sensors from those described above may be provided, and the bond force adjusting actuators and sensors may be arranged in a different manner. In some embodiments, a number of bond force adjusting actuators may be equal to a number of sensors; whereas, in other embodiments, a number of bond force adjusting actuators may be less than a number of sensors. In some embodiments, at least one of the bond force adjusting actuators is aligned on a same axis as at least one of the sensors.

FIGS. 4-7 show top views of bonding apparatuses 400, 500, 600, 700 respectively according to alternative embodiments of the present invention. The bonding apparatuses 400, 500, 600, 700 are similar to the bonding apparatus 100 and thus, the common features are labelled with the same reference numerals and need not be discussed again. The top views of FIGS. 4-7 show each bonding apparatus 400, 500, 600, 700 with the actuating member 132, rotational actuator 140 and cover 142 removed.

Figure 4:
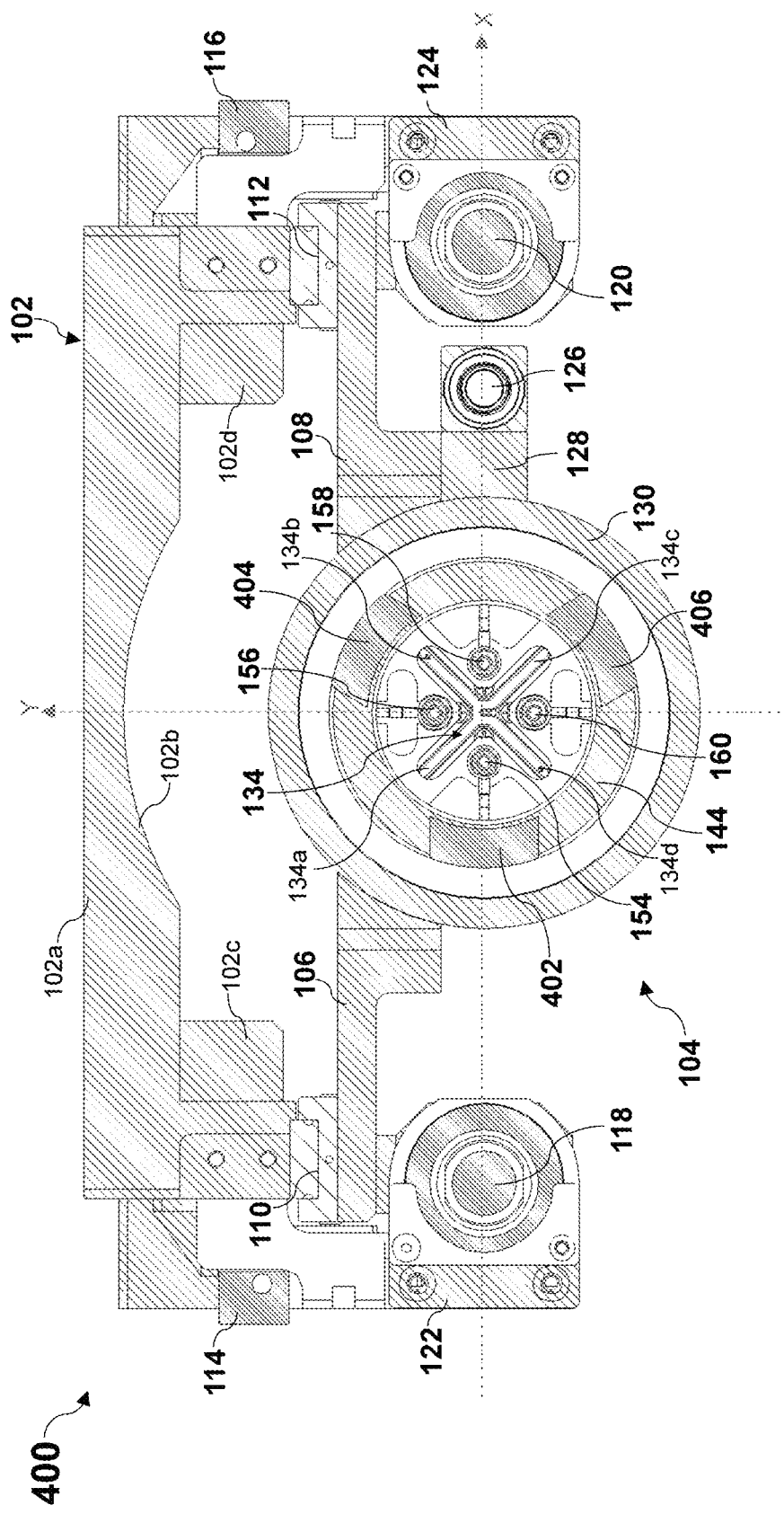
FIG. 4 shows a top view of a part of a bonding apparatus according to an alternative embodiment of the present invention.

Referring to FIG. 4, as compared to the bonding apparatus 100, the bonding apparatus 400 includes only three bond force adjusting actuators 402, 404, 406. The bond force adjusting actuators 404-406 are arranged equidistant around the Z axis. While a first bond force adjusting actuator 402 is aligned with the first and third sensors 154, 158 on the X axis, a second and a third bond force adjusting actuator 404, 406 lie external of the Y axis on which the second and fourth sensors 156, 160 are located.

Figure 5:
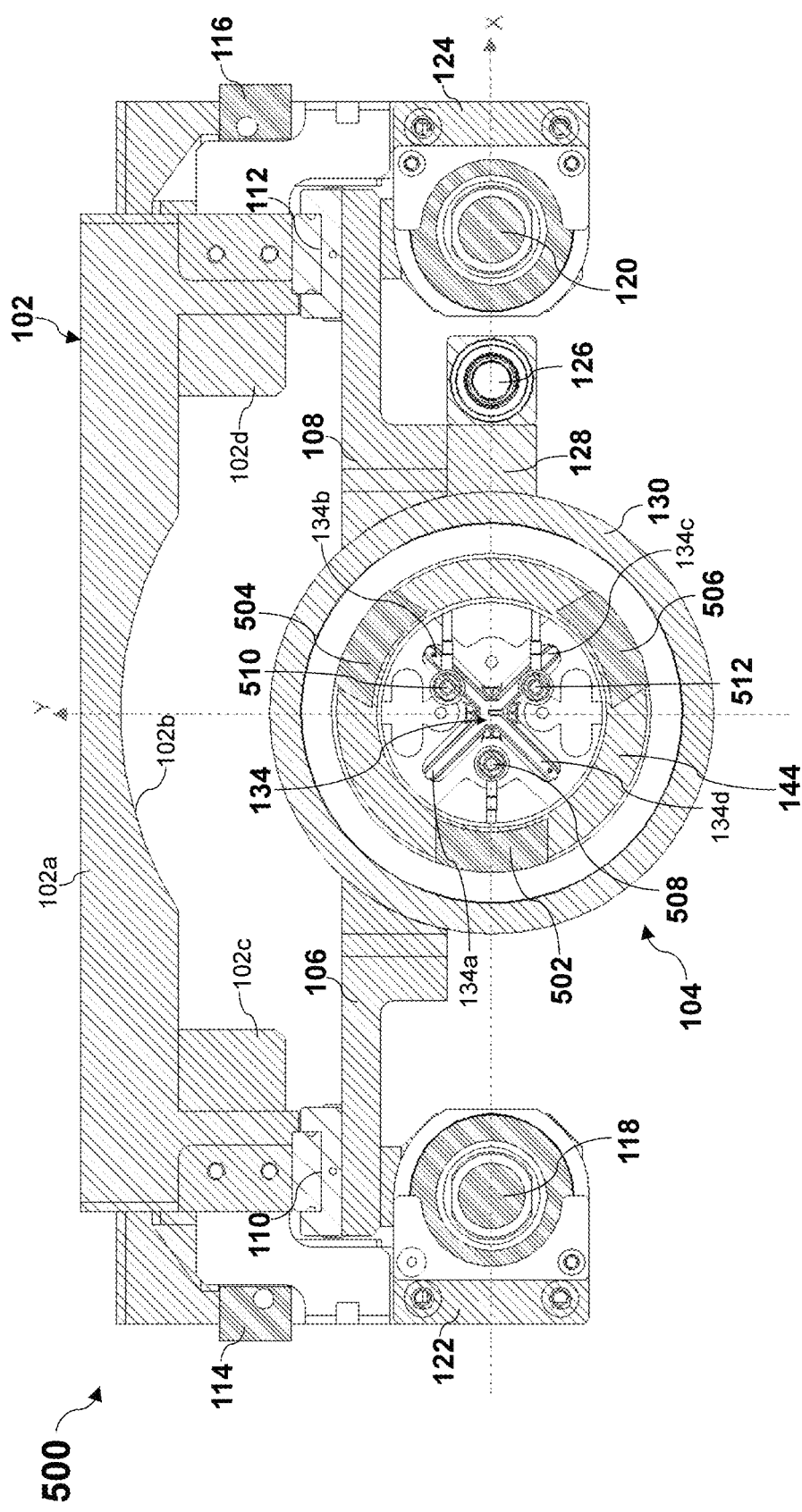
FIG. 5 shows a top view of a part of a bonding apparatus according to another alternative embodiment of the present invention.

Referring to FIG. 5, as compared to the bonding apparatus 100, the bonding apparatus 500 includes only three bond force adjusting actuators 502, 504, 506. Further, unlike the bonding apparatuses 100, 400, the bonding apparatus 500 includes only three sensors 508, 510, 512. As shown in FIG. 5, the bond force adjusting actuators 502, 504, 506 are arranged equidistant about the Z axis. Similarly, the sensors 508, 510, 512 are arranged equidistant about the Z axis. Each bond force adjusting actuator 502, 504, 506 is aligned on a same axis as a respective one of the sensors 508, 510, 512.

Figure 6:
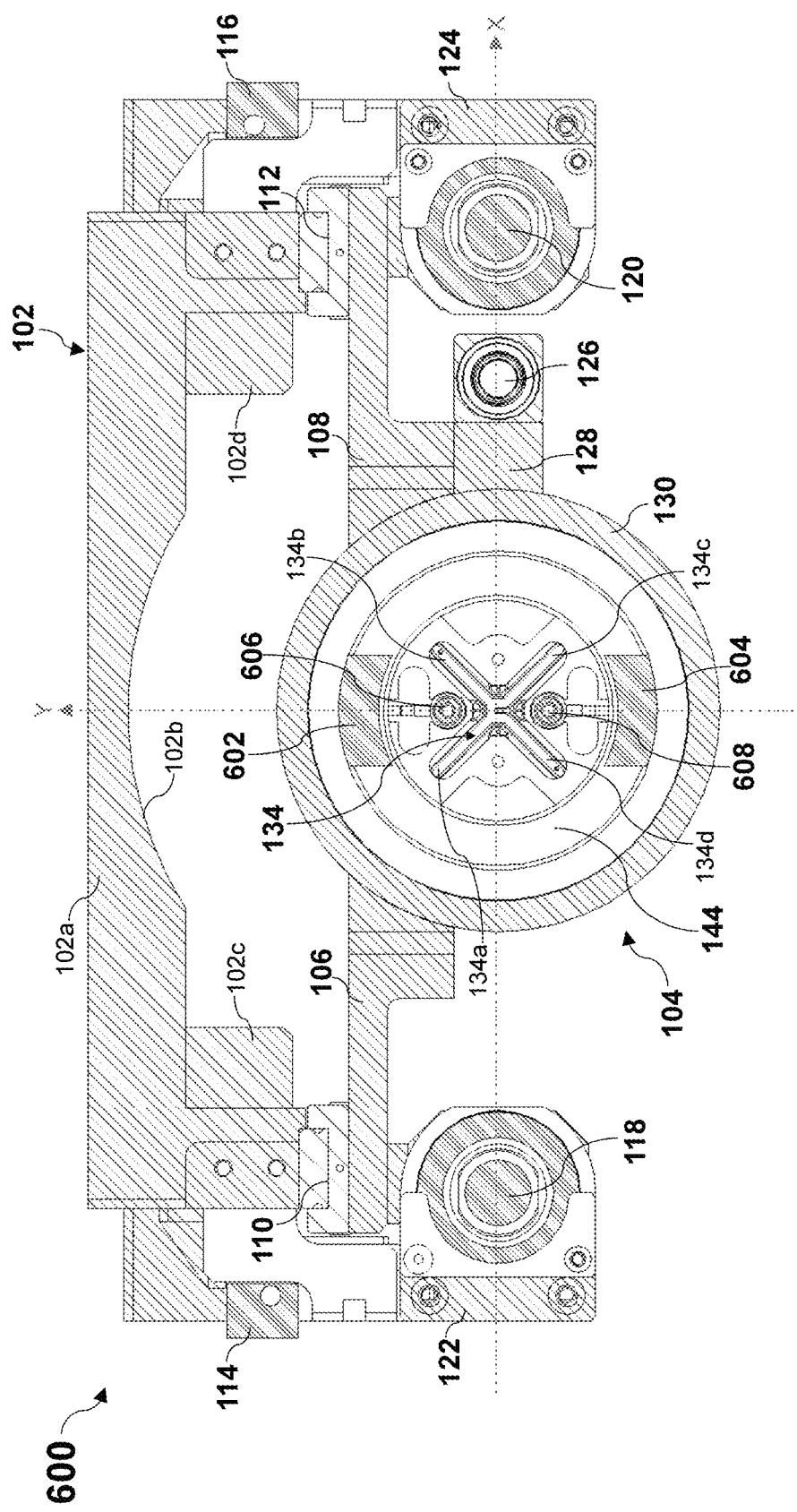
FIG. 6 shows a top view of a part of a bonding apparatus according to yet another alternative embodiment of the present invention.

Referring to FIG. 6, unlike the bonding apparatuses 100, 400, 500, the bonding apparatus 600 includes only two bond force adjusting actuators 602, 604 and only two sensors 606, 608. As shown in FIG. 6, the bond force adjusting actuators 602, 604 are arranged equidistant about the Z axis and are symmetrically arranged about the X axis. Similarly, the sensors 606, 608 are arranged equidistant about the Z axis and are symmetrically arranged about the X axis. The bond force adjusting actuators 602, 604 and the sensors 606, 608 are aligned on a same axis (the Y axis).

Figure 7:
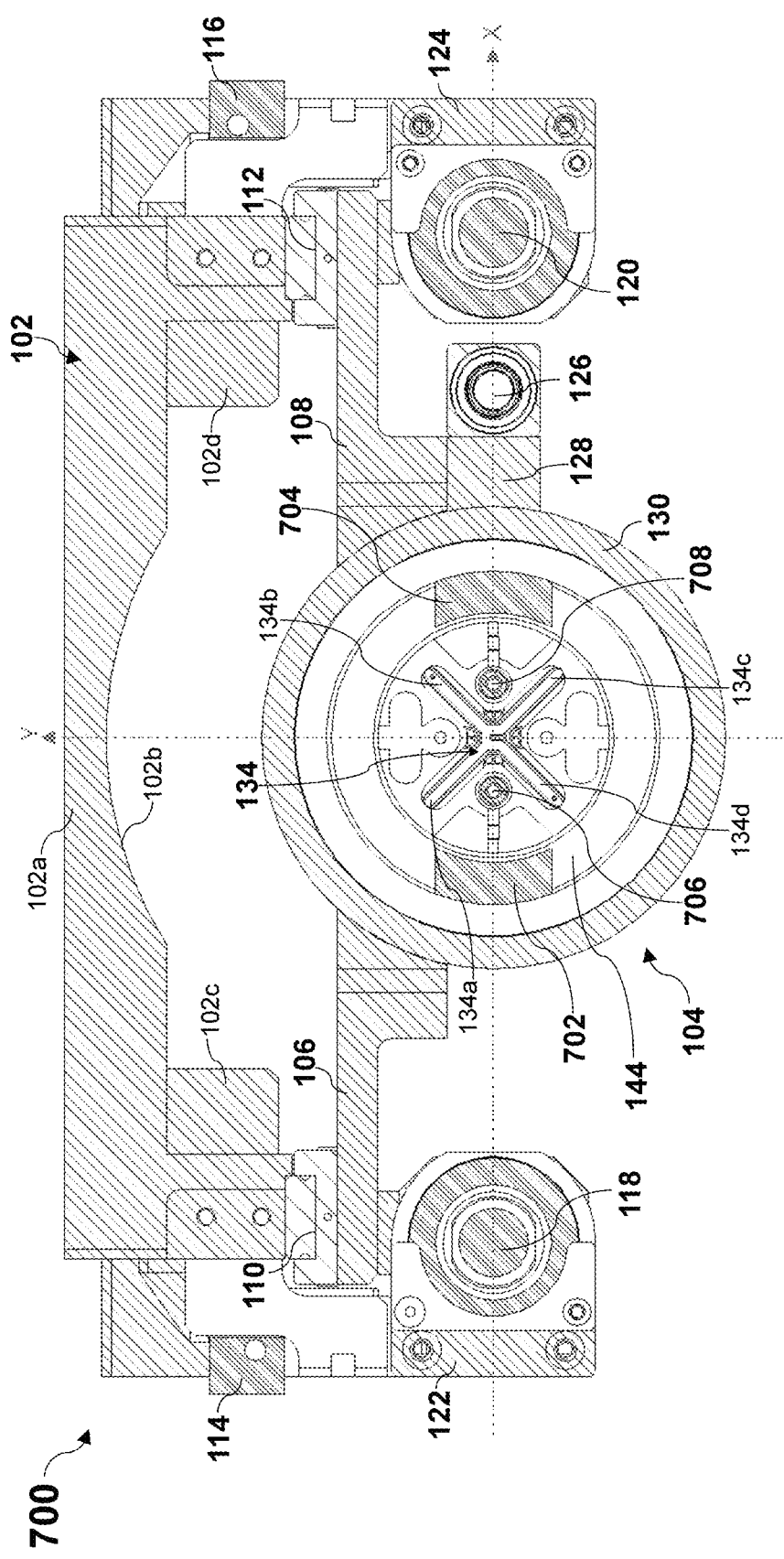
FIG. 7 shows a top view of a bonding apparatus according to yet another alternative embodiment of the present invention.

Referring to FIG. 7, similar to the bonding apparatus 600, the bonding apparatus 700 includes only two bond force adjusting actuators 702, 704 and only two sensors 706, 708. The bond force adjusting actuators 702, 704 and the sensors 706, 708 of the bonding apparatus 700 are arranged in a similar manner as those in the bonding apparatus 600, except that they are aligned on the X axis instead of the Y axis.

A further variation that may be made to the above-described embodiments may be to omit the rotational actuator 140 and/or the actuating member 132. For instance, the bond force adjusting actuators 146-152 may be directly coupled with the holding element 136 to exert bond forces on the associated actuating areas of the holding element 136.

Also, the actuating member 132 may have a structure different from that shown in FIG. 1C. In particular, the actuating member 132 need not have first and second actuating member portions 132a, 132b with elongate apertures having different types of cross-sectional surfaces. The actuating member 132 may instead have elongate apertures with a same type of cross-sectional surface, for example, a circular cross-sectional surface, and with the first elongate aperture of the first actuating member portion 132a having a diameter smaller than a diameter of the second elongate aperture of the second actuating member portion 132b. In some variations, the actuating member 132 may have a single elongate aperture with a constant diameter. In some variations, the actuating member 132 may not even have a hollow structure.

Figure 8:
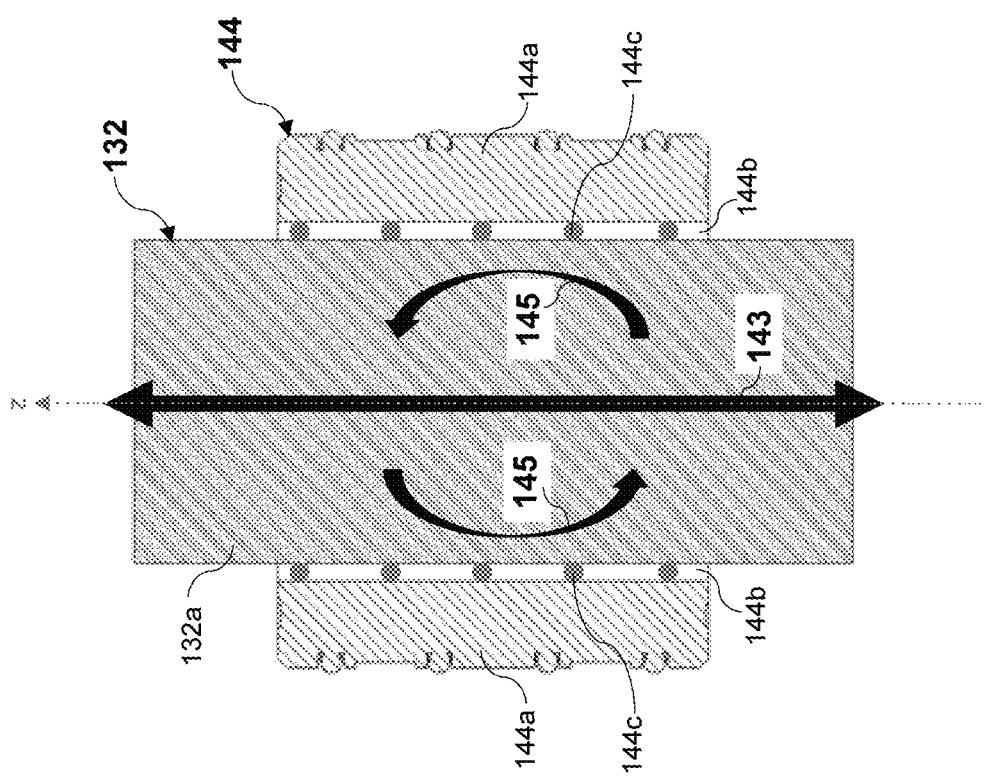
FIG. 8 shows an alternative compliant element that may be used in the bonding apparatus of FIGS. 1A to 1C.

In addition, the compliant element 144 need not be in the form of a compliant air bearing. For example, FIG. 8 shows the compliant element 144 in the form of a compliant roller ball bearing. The roller ball bearing 144 includes a housing 144a, a compliant compartment 144b and a plurality of ball rollers 144c arranged within the compliant compartment 144b. Each ball roller 144c is formed of an elastic material and is thus deformable. Accordingly, similar to the air bearing, the compliant compartment 144b of the roller ball bearing 144 is compressible by rotation of the actuating member 132 about one or more axes perpendicular to the Z axis. Therefore, the actuating element 132 can move not only relative to the compliant element 144 along the Z axis (as indicated by the arrow 143) but can also rotate about the Y axis (as indicated by the arrows 145) by compressing the compliant element 144. However, the degree of rotation is limited by the stiffness of the compliant compartment 144a.

Also, the controller may be configured to determine the bond forces in various ways. For example, the controller may be configured to determine the bond force to be exerted by each of the plurality of bond force adjusting actuators 146-152 based on a reaction force measured by one of the plurality of sensors 154-160 nearest to the bond force adjusting actuator 146-152.

In addition, when contacting the electrical component 202 with the base member 204 as shown in FIG. 2A, the bond head structure 104 may be tilted about the Y axis at various angles. For instance, the angle 210 between the electrical component 202 and the base member 204 as shown in FIG. 2A may range between 5 to 10 degrees. In FIG. 2A, the bond head structure 104 is shown as tilted anti-clockwise about the Y axis. However, in some embodiments, the bond head structure 104 may be tilted clockwise about the Y axis. In other words, the first holding element actuator 118 may urge the bond head structure 104 in the second actuating direction 208 (upwards) and the second holding element actuator 120 may urge the bond head structure 104 in the first actuating direction 206 (downwards).

In some embodiments, the bond head structure 104 is not tilted about the Y axis to contact the electrical component 202 with the base member 204. Instead, the holding element actuators 118, 120 may be configured to exert substantially equal forces in a same direction (the first actuating direction 206) on the respective bond head connectors 106, 108, so that the holding element 136 remains substantially parallel to the base member 204 throughout its movement towards the base member 204. In other words, the holding element 136 may be moved only in a single actuating direction parallel to the Z axis.

Further, various tools can be used together with the bonding apparatus in the above-described embodiments. For example, calibration tools or collets may be used to measure the tilt of the electrical component 202 and the bond forces to be exerted by the bond force adjusting actuators 146-152 may be based on both the output from the calibration tools or collets and the output from the sensors 154-160.

The invention described herein is susceptible to variations, modifications and/or additions other than those specifically described and it is to be understood that the invention includes all such variations, modifications and/or additions which fall within the spirit and scope of the above description.

The invention claimed is:

1. A bonding apparatus comprising:
a holding element configured to hold an electrical component;
a plurality of holding element actuators configured to move the holding element in one or more actuating directions to contact the electrical component with a base member, wherein the one or more actuating directions are arranged to be generally parallel to a central axis of the holding element extending through the electrical component and the base member;
a plurality of sensors, each sensor being configured to measure a reaction force exerted on the holding element at a respective position on the holding element in response to contact between the electrical component and the base member;
a controller configured, based on the reaction forces measured at the respective positons, to determine bond forces to be exerted at two or more actuating areas of the holding element during a bonding process to bond the electrical component to the base member; and
a plurality of bond force adjusting actuators operative to exert the determined bond forces at the corresponding actuating areas of the holding element during the bonding process.

2. The bonding apparatus according to claim 1, wherein the holding element and the plurality of bond force adjusting actuators are operatively connected to be movable together in the one or more actuating directions.

3. The bonding apparatus according to claim 1, further comprising an actuating member connected between the plurality of bond force adjusting actuators and the holding element.

4. The bonding apparatus according to claim 3, wherein the actuating member comprises a first and a second actuating member portion respectively having a first and a second elongate aperture oriented parallel to the central axis, and wherein the first actuating member portion is nearer to the holding element than the second actuating member portion and the first elongate aperture has a diameter smaller than a diameter of the second elongate aperture.

5. The bonding apparatus according to claim 3, further comprising a compliant element coupled to the actuating member, wherein the compliant element is compressible by rotation of the actuating member about one or more axes perpendicular to the central axis.

6. The bonding apparatus according to claim 1, wherein the bond force adjusting actuators are arranged equidistant around the central axis.

7. The bonding apparatus according to claim 1, wherein the plurality of bond force adjusting actuators comprise first, second, third and fourth bond force adjusting actuators, wherein the first bond force adjusting actuator is arranged diametrically opposite to the third bond force adjusting actuator with respect to the central axis, and the second bond force adjusting actuator is arranged diametrically opposite to the fourth bond force adjusting actuator with respect to the central axis.

8. The bonding apparatus according to claim 1, wherein at least one of the plurality of bond force adjusting actuators is aligned on an axis that is the same as or parallel to an axis of at least one of the plurality of sensors.

9. The bonding apparatus according to claim 1, wherein the plurality of bond force adjusting actuators is operative to exert different bond forces at different corresponding actuating areas of the holding element during the bonding process.

10. The bonding apparatus according to claim 1, wherein the plurality of holding element actuators is operative to tilt the holding element about one or more axes perpendicular to the central axis.

11. The bonding apparatus according to claim 1, further comprising a plurality of connectors, and each of the plurality of holding element actuators is configured to urge a respective one of the plurality of connectors in one or more directions parallel to the central axis, to move the holding element in the one or more actuating directions.

12. The bonding apparatus according to claim 1, further comprising a rotational actuator configured to rotate the holding element about the central axis.

13. The bonding apparatus according to claim 1, wherein the controller is configured to determine the bond force to be exerted by each of the plurality of bond force adjusting actuators based on a reaction force measured by one of the plurality of sensors nearest to the bond force adjusting actuator.

14. The bonding apparatus according to claim 1, wherein a number of bond force adjusting actuators is equal to a number of sensors.

15. The bonding apparatus according to claim 1, wherein a number of sensors is more than a number of bond force adjusting actuators.

16. A method for bonding an electrical component to a base member, the method comprising:
moving a holding element holding the electrical component in one or more actuating directions to contact the electrical component with the base member, wherein the one or more actuating directions are generally parallel to a central axis of the holding element extending through the electrical component and the base member;
measuring reaction forces exerted on the holding element with sensors at respective positions on the holding element in response to contact between the electrical component and the base member;
determining bond forces to be exerted on two or more actuating areas of the holding element during a bonding process to bond the electrical component to the base member, wherein the bond forces are determined based on the measured reaction forces; and
exerting the determined bond forces at the actuating areas of the holding element during the bonding process.

17. The method according to claim 16, wherein moving the holding element further comprises:
tilting the holding element about an axis perpendicular to the central axis;
contacting the electrical component with the base member while the holding element remains tilted; and
rotating the holding element about the axis perpendicular to the central axis to further contact the electrical component with the base member until the electrical component becomes substantially parallel to the base member.

18. The method according to claim 17, wherein rotating the holding element about the axis perpendicular to the central axis further comprises:
exerting a first force in a direction away from the base member on a first side of the holding element; and
exerting a second force in a direction towards the base member on a second side of the holding element, wherein the second force is larger than the first force.

19. The method according to claim 16, wherein the reaction forces comprise a first reaction force exerted on a first position of the holding element and a second reaction force exerted on a second position of the holding element, and wherein the method further comprises repeatedly measuring the reaction forces, determining the bond forces based on the measured reaction forces and exerting the determined bond forces on the actuating areas of the holding element until a difference between the first and second reaction forces is below a predetermined threshold.

* * * * *